United States Patent [19]
Yakubov et al.

[11] Patent Number: 5,805,471
[45] Date of Patent: Sep. 8, 1998

[54] DRIVER BOARD APPARATUS HAVING SRAM AND BURN-IN SYSTEM AND METHOD USING HOST COMPUTER

[75] Inventors: Sergey Yakubov, Fremont; Aijaz M. Khan, Santa Clara; Penikalapati Ravendranath, San Jose; K. Prakash, Fremont; Michael Eliashberg, San Jose; Major Singh, Sunnyvale, all of Calif.

[73] Assignee: Pycon, Inc., Santa Clara, Calif.

[21] Appl. No.: 730,964

[22] Filed: Oct. 15, 1996

Related U.S. Application Data

[63] Continuation of Ser. No. 332,916, Nov. 1, 1994, abandoned.

[51] Int. Cl.[6] ............................................ G06F 17/00
[52] U.S. Cl. ................................................... 364/579
[58] Field of Search ........................................ 364/579

[56] References Cited

U.S. PATENT DOCUMENTS

| | | | |
|---|---|---|---|
| 3,939,381 | 2/1976 | Meany | 317/101 |
| 4,388,719 | 6/1983 | Soltysik et al. | 371/27 |
| 4,639,919 | 1/1987 | Chang et al. | 371/27 |
| 4,656,632 | 4/1987 | Jackson | 371/20 |
| 4,675,673 | 6/1987 | Oliver | 340/825.87 |
| 4,689,791 | 8/1987 | Ciuciu et al. | 371/27 |
| 4,833,600 | 5/1989 | Brodsky | 364/240.9 |
| 4,866,714 | 9/1989 | Adams et al. | 371/22.1 |
| 4,902,969 | 2/1990 | Gussman | 324/158 R |
| 4,926,117 | 5/1990 | Nevill | 324/158 |
| 4,926,363 | 5/1990 | Nix | 364/579 |
| 4,928,278 | 5/1990 | Otsuji et al. | 307/303 |
| 4,989,209 | 1/1991 | Littlebury et al. | 371/22.1 |
| 5,079,442 | 1/1992 | Hooker, Jr. | 307/303 |
| 5,107,205 | 4/1992 | Ebihara | 324/258 |
| 5,222,066 | 6/1993 | Grula et al. | 371/21.1 |
| 5,265,102 | 11/1993 | Saito | 371/27 |
| 5,390,129 | 2/1995 | Rhodes | 364/480 |

*Primary Examiner*—Ellis B. Ramirez
*Attorney, Agent, or Firm*—Dergosits & Noah LLP

[57] ABSTRACT

The present invention provides a driver board which can be used with a wide range of test patterns and devices, and includes the capability to modify the edge connector configuration. The driver board contains a CPU module for communicating with a host computer. The board also utilizes SRAM for test pattern memory. The board can be used to sense output of the devices under test to determine when failures have occurred. The device can optionally be provided with JTAG capability, analog channels and high frequency clocks. In a particularly preferred embodiment, the test pattern memory is provided on a separate board which can be plugged into the main board.

12 Claims, 3 Drawing Sheets

DRIVER BOARD APPARATUS HAVING SRAM AND BURN-IN SYSTEM AND METHOD USING HOST COMPUTER

This is a continuation of application Ser. No. 08/322,916 filed on Nov. 1, 1994 now abandoned.

TECHNICAL FIELD OF THE INVENTION

This invention relates generally to driver board apparatus and methods for their use which are employed in the manufacture of semiconductor devices. This invention relates to the use of static random access memory to store the test patterns for the burn-in procedure, and to the use of a host computer and an on-board CPU to enable the system to be used with a variety of test patterns and a variety of ovens having different edge connector configurations. The invention also uses call and return architecture.

BACKGROUND OF THE INVENTION

Integrated circuits often fail during their initial stage of operation. In an effort to provide reliable semiconductor devices, manufacturers have used driver board devices to age the devices at an accelerated rate. This procedure improves the reliability of the semiconductors by providing rapid failure of the defective semiconductor devices. Burn-in procedures rapidly age the device using test patterns which represent nearly worse case conditions for the device being aged, and involve the application of increased temperature to increase the rate of the aging reaction. After the burn-in procedure, the devices must be monitored to identify the devices which have failed or which are showing a tendency to failure. These devices can be separated from the balance of the lot, and the manufacturer can be assured that the devices which are shipped are reliable.

Previous burn-in devices have been limited in their application by two factors. The first is a limited capability to store test patterns and to change test patterns after the board has been shipped to the customer. Since memory is an expensive component, the number of test patterns stored in a driver board is directly proportional to the cost of the device. Therefore, an optimum is reached where the number of stored test patterns is adequate for processing without undue expense. Similarly, the ability to change the test patterns stored in memory on the driver board has been limited, thus reducing the number and type of devices which can be processed with a particular board.

The second limiting factor has been the edge connector configuration. When the board is designed for use with a particular oven, the edge connectors are set, and no provision is made for adapting the board to a new edge connector configuration. This results in a dedicated board which cannot be used with other ovens.

SUMMARY OF THE INVENTION

The present invention provides a solution to these problems associated with previous driver boards. According to the present invention, the driver board is provided with a CPU module for communication with a host computer which can deliver various test patterns and can change the edge connector configuration to make the driver board more widely applicable than the dedicated driver boards. The present invention also provides SRAM as the memory component, allowing adequate memory capacity and the ability to retain data after the board has been powered down. These advantages are achieved in a low cost solution, while providing a driver board which can be used with a large number of devices and ovens. The call and return architecture provides an advantage because it provides the ability to store repeated test vectors as functions and call them when needed without any timing change. It uses a pipeline architecture as its core design technique.

DETAILED DESCRIPTION OF THE PREFERRED EMBODIMENT

Figure 1:
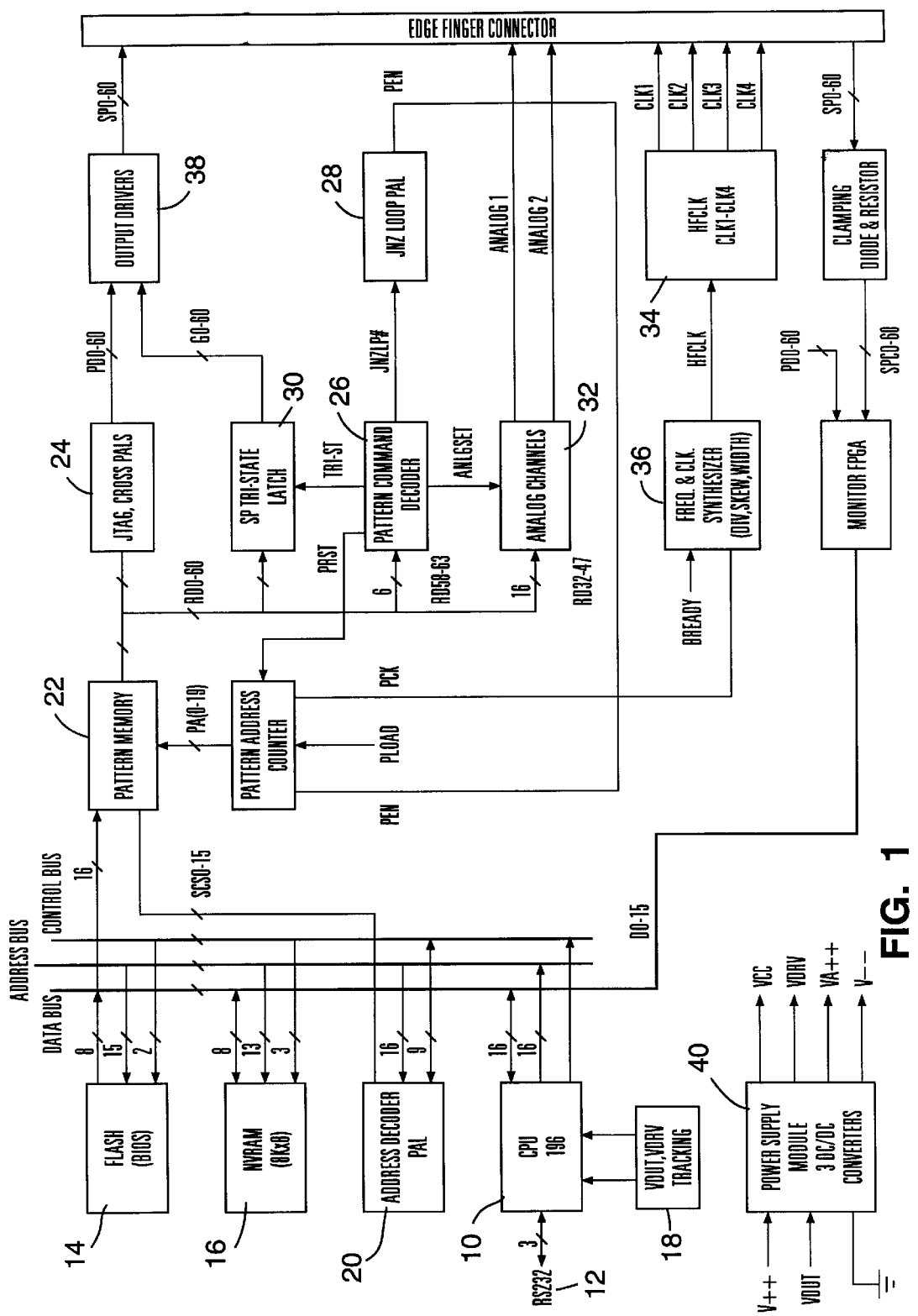
FIG. 1 is a block diagram for the driver board of the present invention.

The present invention will be described with reference to a particularly preferred embodiment. A block diagram for this embodiment is shown in FIG. 1 where the CPU is designated as reference 10. CPU 10 is the central component for the CPU module which consists of the 16 bit microcontroller (Intel N80C196KC), the RS232 port 12 for communication with a host computer, BIOS 14, NVRAM 16 and a component 18 for tracking VDUT (device under test=DUT) and VDRV. These components of the CPU module also have associated TTL latches.

The CPU module handles all communication with the host computer through the RS232 link. The CPU module receives and executes commands and test pattern data from the host computer, writes the received test patterns into a pattern memory 22 (SRAM) and tracks the volume level of the driver (VDRV).

An address decoding PAL module 20 decodes addresses received from the CPU 10 to generate device select signals for use by BIOS 14, NVRAM 16, pattern memory 22 and the associated latches.

A memory module consists of RAM registers, SRAM 22, Cross PALs and joint test action group (JTAG) programmable array logic (PAL) 24 and a pattern decoder 26. In the preferred embodiment, the pattern memory 22 is mounted on a separate board which is plugged into the option connector on the main board. The RAM registers consist of eight Octal D-latches to hold the 64 bit data. SRAM 22 is arranged to have a width (word size) of 64 bit and the depth can be up to 1MB. The 64 bit word contains data and the commands necessary to control the board functions.

Pattern decoder 26 decodes the command portion of the 64 bit word to generate control signals which are used to reset pattern addresses, initialize the JNZ loop 28. initialize JTAG mode, tri-state special pulse channels and associated latches 30. The control signals also set the analog channel 32 levels. JTAG PAL 24 performs parallel to serial conversion to generate the JTAG signals: TDI, TDO, TCK and TMS. The Cross PAL 24 is used to map a CLK2 signal from the high frequency clock 34, a BRDY signal and JTAG signals to different special pulse channels.

A timing module 36 is mainly responsible for generating the master clock for all the devices and for generating the addresses for the pattern memory 22. The timing module 36 also has a JNZ loop which is an 8 bit loadable counter to freeze any pattern during the run time for up to 64K high frequency clock cycles maximum.

An input/output module 38 consists of Octal D-latches and buffers. All test patterns are connected to the driver board's special pulse channels through buffers to provide higher fan-out. The D-latches enable the output buffers when the test patterns are running and disable them otherwise.

The high frequency clock module 34 generates four high frequency clocks (maximum up to 50 mhz.) Any one or more clocks can be configured and made available on the special pulse channels.

The analog channel module 32 consists of two 8 bit digital to analog converters and supporting circuitry to generate two analog signals. The voltage levels of the analog signals can be between±12V with a maximum frequency of 1 MHz.

A power supply module 40 consists of three DC/DC converters. These converters are labeled as VR2A1, VR2 and VR3 on the driver board. The input to the DC/Dc converters is 14 volts supplied from the tester power supply. VR2A1 converts 14V to 5V and serves as VCC for all logic components on the driver board. VR2 converts 14V to approximately VDUT+0.5V for the buffers in the input/output module 38. VR3 converts 14V to VA++ (+15V) and VA− (−15V) for the two analog channels in the analog channel module 32.

The output driver channels which form part of the input/output module 38 are short circuit immune. The special pulse drivers have 61 configurable outputs of 25 Mhz or higher and all special pulse channels can be independently tri-stated. The high frequency clock drivers associated with the high frequency clock module 34 can be operated from 1 to 50 Mhz in steps of 500 Khz. The drivers can be configured so that up to four output channels can be achieved with 50 mhz clock frequency. The clock has a ±100 ppm accuracy, and permits on the fly high frequency clock control. The clock can be started and stopped on demand.

The driver board provides a CLK2 Option, based upon the high frequency clock module 34. The CLK2 Option can be configured by any special pulse channel output driver multiplexed from RAM input or CLK2 circuitry input. The CLK2 outputs are high frequency clock divided by 2, 4, 8 or 16 phase selectable and synchronized to the high frequency clock.

A CLK2 free run can be started or stopped at any time while the vectors are halted.

The driver board also provides a BRDY Option which can be configured by any special pulse channel output driver multiplexed from the RAM input or BRDY circuitry input. The pulse position can be modified to include a programmable delay of 1 to 15 high frequency clock periods and is phase selectable. The pulse duration can be programmed to have a width between 1 and 15 high frequency clock periods. Like the CLK2 option, the BRDY option can be started or stopped any time that the vectors are halted.

The driver board is further provided with an analog channel option which can be multiplexed with the special pulse channels. The static voltage range of the analog channel is −12 VDC to +12 VDC in steps of 100 mV. The timing voltage range is from 0 to DUT (device under test) VCC voltage=/−0.5 VDC. The maximum frequency of operation is 1 Mhz with 150 mA current. The digital signal source is generated from its own memory and is independently set.

The preferred embodiment is also equipped with the JTAG Option which includes the ability to shift parallel data from its pattern source to a serial data stream in order to provide JTAG driving capability. Any special pulse channel output driver can be multiplexed from RAM input or JTAG circuitry input.

The pattern characteristics for the present invention can be adjusted based upon the pattern clock frequency. The pattern can be used with the high frequency clock and then divided by 1 to 256 with a maximum of 25 Mhz. The pattern can also be programmed to have a delay in steps of 0.5 ns or less in reference to the high frequency clock. The delay range is at least half of the high frequency clock period, with a maximum of 128 ns shift. This delay would not delay the next clock cycle. The pattern depth runs from 256K and is expandable to 1 M bit. The pattern width is 61 bits. The pattern can be stopped during run time for the range of 64K of the high frequency clock (16 bit value). the numbers of clocks delay can be stored at the pattern.

The driver board of the preferred embodiment can retain the pattern for up to twenty-four hours from the time when the power is removed. The pattern can be downloaded from a remote computer, and the pattern may be verified on demand, including during pattern operation.

The VCC Sense is configured to operate using software controlled level detection. EOS detection is employed to compare voltage between the circuit and the software set level. Electrical overstress condition at a rate of 20 ns or greater is latched as a failure. The driver channel VOH control can be set in two manners: (i) setting the special pulse and high frequency clock channels to track the VCC sense line level; and (ii) using the software to select the VOH level of the special pulse and high frequency clock channels. No driver channel VOH exceeds VCC sense voltage level, except for the analog channel VOH level.

Signal monitoring is accomplished using real time monitoring or window monitoring. In the real time monitoring mode, all tristable driver channels can be used for driver board DUT monitoring. The data returned from the driver board measures the DUT output for the correct logic state at each cycle within the data pattern. The data returned from the driver channel output measures driver output signals for the correct logic state at each cycle within the data pattern. The logic level evaluation with voltage thresholds for VOH and VOL levels for every special pulse/DUT monitor signal can be measured during each data cycle. The data strobe is synchronized with the pattern and can be enabled at specific memory locations with delay control within the cycle. The compare data source is stored in RAM for the monitored driver channels and or driver board output monitors.

In the window monitoring mode, the board can monitor twenty-four different special pulse channels. Sixteen (16) bit counters are used for the measurement. The host computer stores the source that is used to compare with the accumulated source. The pattern is used to control the window position. Window duration can be controlled by either the pattern or by the driver setup configuration. An error log is created and can be poled by host to store the fails during monitoring. The window mode can monitor clock functionality and flag error for the high frequency and pattern clocks.

The driver board identification capability of the present invention can identify electronically the driver board serialization identification. The code is alphanumeric with 1 alpha character and 5 digits.

Figure 2:
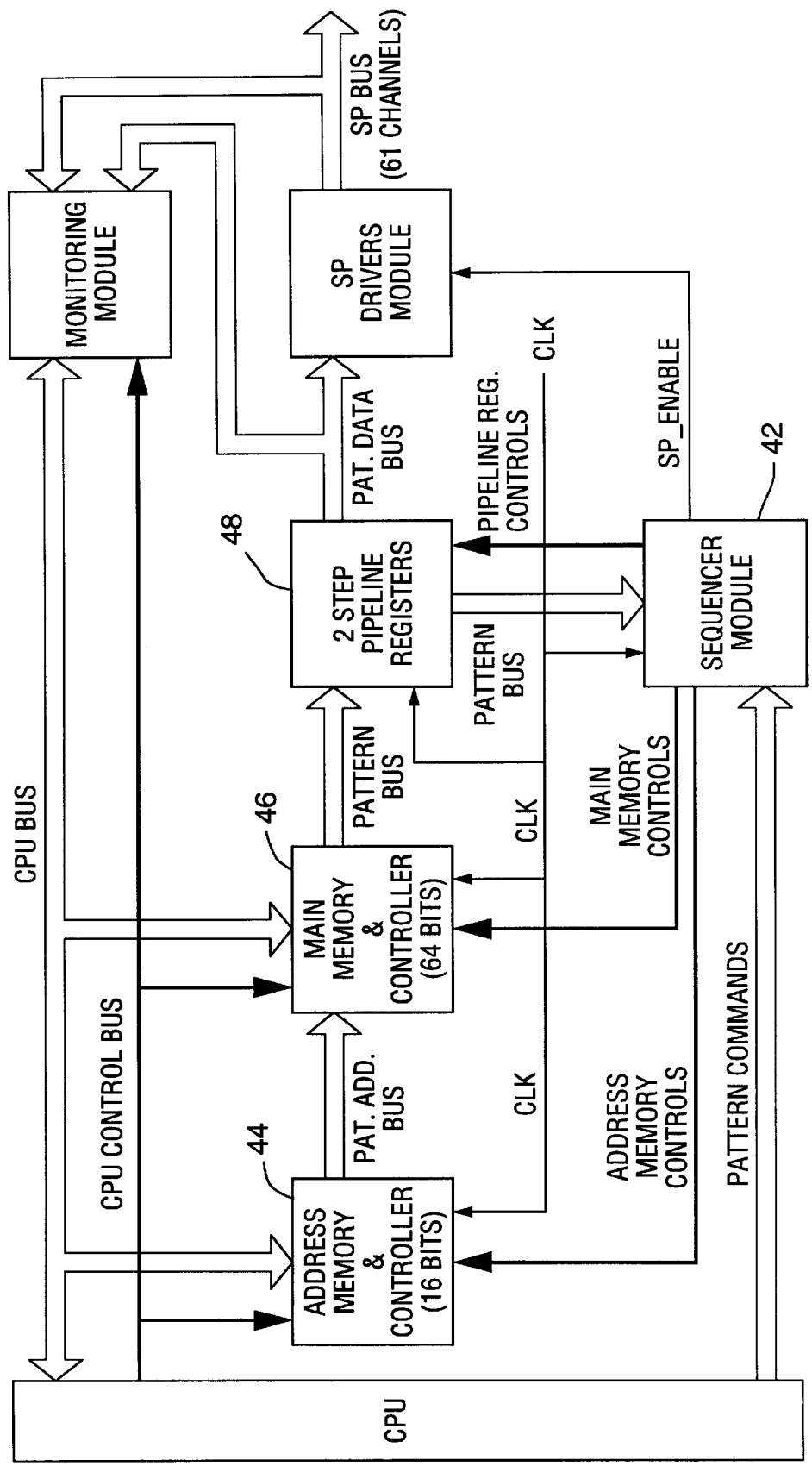
FIG. 2 is a block diagram showing the call and return architecture of the driver board of the present invention.

Call and return architecture is described with reference to the block diagram shown in FIG. 2. The call and return architecture provides an advantage because it provides the ability to store repeated test vectors as functions and call them when needed without any timing change. It uses a pipeline architecture as its core design technique. The main design blocks are a sequencer module 42, an address memory and controller module 44, main memory and controller module 46, and pipeline register module 48.

The software running on the host computer analyzes the test vectors to be used and stores the pattern data along with the functions in the main memory 46. The address of the functions called are stored in the address memory 44. The sequencer 42 which is the main controller of this architecture issues a command for the main memory 46 to start outputting the pattern data sequentially. When a command bit indicating a function call is detected, the sequencer 42 issues a command to the main memory 46 to jump to a certain address as specified by the address memory and controller module 44. This jump is done without any loss of data because of the pipelined architecture as shown in FIG. 2.

Figure 3:
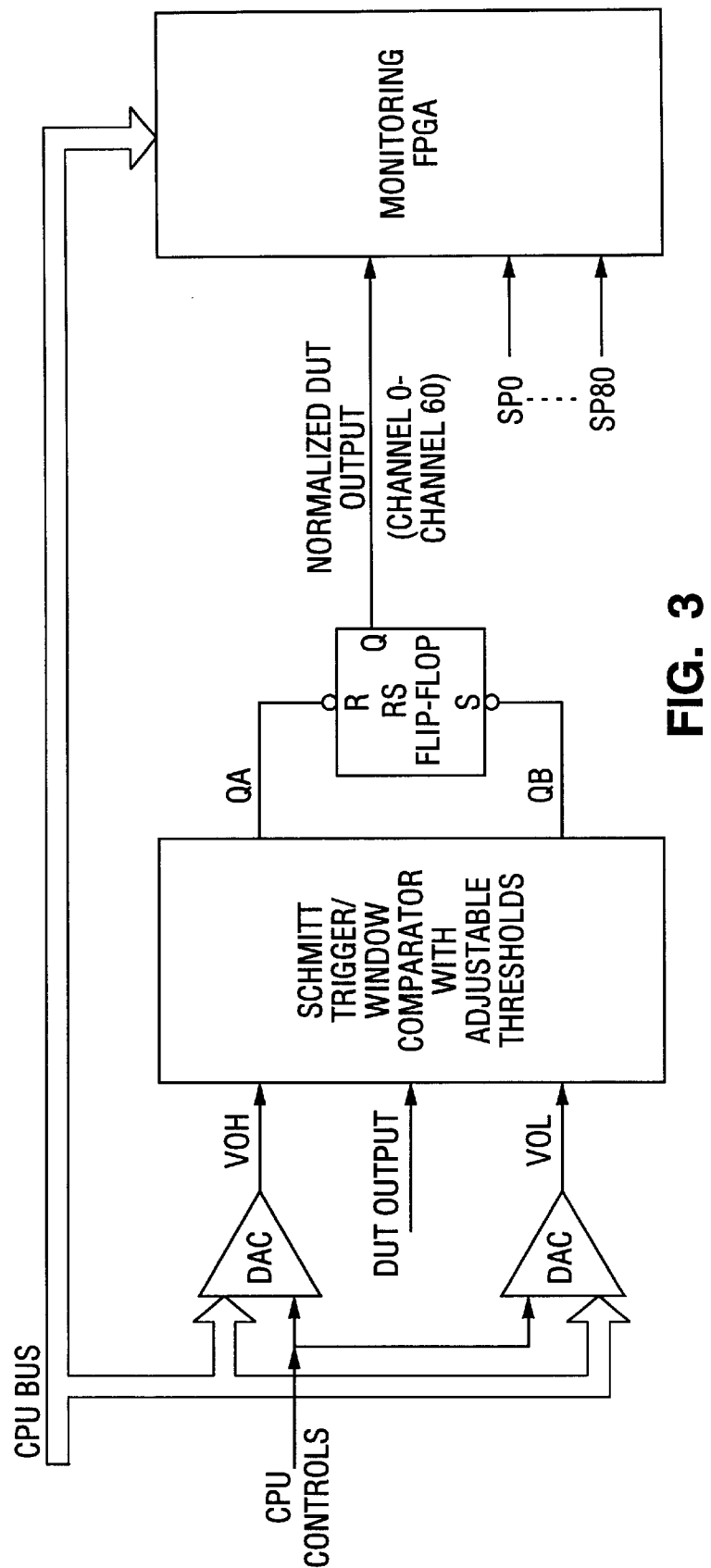
FIG. 3 is a block diagram showing the high speed comparators used in the present invention.

This architecture also consists of the high speed comparators as shown in FIG. 3, which enables VOH and VOL threshold comparisons fore all special pulse channels. This architecture also enables the pattern to be run up to 25 MHz.

Although the invention has been described with reference to particular embodiments, it is to be appreciated that various adaptations and modifications may be made and that the invention is only to be limited by the appended claims.

We claim:

1. A driver board for use in burn-in testing of semiconductor devices using test (DUTS) patterns which comprises:
    (a) an input/output module having at least one special pulse channel for output of test patterns to a semiconductor device under test (DUT) and input to the driver board of data received from the DUT in response to the test pattern, the input/output module communicating with the DUT through an edge connector assembly;
    (b) a memory module comprising (I) at least one SRAM device for storing test pattern data and (ii) a pattern decoder for extracting command data from the test pattern data, for generating a control signal for reset of pattern address and for tristating the special pulse channel;
    (c) a CPU module for communication with a host computer to receive and execute commands and test patterns from the host computer, to write test patterns into the memory module, and to track VDRV;
    (d) a timing module for generating a master clock for all DUTs and to generate the addresses for the memory module;
    (e) a decoding PAL module for decoding addresses from the CPU module to generate semiconductor device select signals to be used by the CPU module; and
    (f) a power supply module for powering the logic and memory devices on the driver board,
wherein the board outputs a test pattern through the input/output module to a DUT, and wherein the input/output module receives data from the DUT which is measured for a correct logic state at each cycle within the data pattern.

2. The driver board of claim 1 further comprising a high frequency clock module which is configured for and available for use on the input/output module special pulse channel.

3. The driver board of claim 1 further comprising an analog channel module for the generation of analog signals for use in testing.

4. The driver board of claim 1 wherein the memory module comprises a separate board which is plugged into the main board.

5. The driver board of claim 1 wherein the memory module further comprises a serialization FPGA module for parallel to serial conversion of test pattern data to generate JTAG signals.

6. A driver board system for use in burn-in testing of semiconductor devices using test patterns which comprises:
    (a) an input/output module having at least one special pulse channel for output of test patterns to a semiconductor device under test (DUT) and input to the driver board of data received from the DUT in response to the test pattern, the input/output module communicating with the DUT through an edge connector assembly;
    (b) a memory module comprising (i) at least one SRAM device for storing test pattern data and (ii) a pattern decoder for extracting command data from the test pattern data, for generating a control signal for reset of pattern address and for tristating the special pulse channel;
    (c) a host computer for test pattern downloading, verification and running;
    (d) a CPU module for communication with a host computer to receive and execute commands and test patterns from the host computer, to write test patterns into the memory module, and to track VDRV;
    (e) a timing module for generating a master clock for all DUTs and to generate the addresses for the memory module;
    (f) a decoding PAL module for decoding addresses from the CPU module to generate semiconductor device select signals to be used by the CPU module; and
    (g) a power supply module for powering the logic and memory devices on the driver board,
wherein the driver board system outputs a test pattern through the input/output module to a DUT, and wherein the input/output module receives data from the DUT which is measured for a correct logic state at each cycle within the data pattern, and the measured DUT data is compared to values stored for the correct logic state at each cycle during the test pattern.

7. The driver board of claim 6 further comprising a high frequency clock module which is configured for and available for use on the input/output module special pulse channel.

8. The driver board of claim 6 further comprising an analog channel module for the generation of analog signals for use in testing.

9. The driver board of claim 6 wherein the memory module comprises a separate board which is plugged into the main board.

10. The driver board of claim 6 wherein the memory module further comprises a serialization FPGA module for parallel to serial conversion of test pattern data to generate JTAG signals.

11. A method for burn-in testing of a semiconductor device which comprises the steps of:
    (a) providing a system which comprises:
        (i) an input/output module having at least one special pulse channel for output of test patterns to a semiconductor device under test (DUT) and input to the driver board of data received from the DUT in response to the test pattern, the input/output module communicating with the DUT through an edge connector assembly;
        (ii) a memory module comprising (1) at least one SRAM device for storing test pattern data and (2) a pattern decoder for extracting command data from the test pattern data, for generating a control signal for reset of pattern address and for tristating the special pulse channel;
        (iii) a host computer for test pattern downloading, verification and running;
        (iv) a CPU module for communication with a host computer to receive and execute commands and test patterns from the host computer, to write test patterns into the memory module, and to track VDRV;

(v) a timing module for generating a master clock for all DUTs and to generate the addresses for the memory module;

(vi) a decoding PAL module for decoding addresses from the CPU module to generate semiconductor device select signals to be used by the CPU module; and (vii) a power supply module for powering the logic and memory devices on the driver board, (b) connecting the system to the DUT;

(c) provide a test pattern and edge connector pattern from the host computer to the memory module of the system;

(d) receiving data from the DUT at the input/output module; and (e) comparing the received data with source data stored in the memory module to determine whether the DUT is responding to the input test pattern according to the DUT design.

12. The method of claim 11 wherein the memory module creates an error log for each DUT which fails under test.

* * * * *